(12) United States Patent
Meyer et al.

(10) Patent No.: US 8,546,172 B2
(45) Date of Patent: *Oct. 1, 2013

(54) LASER POLISHING OF A BACK CONTACT OF A SOLAR CELL

(75) Inventors: Dallas W. Meyer, Prior Lake, MN (US); Jason Stephen Corneille, San Jose, CA (US); Steven Thomas Croft, Menlo Park, CA (US); Mulugeta Zerfu Wudu, San Jose, CA (US); William James McColl, Palo Alto, CA (US)

(73) Assignee: Miasole, Santa Clara, CA (US)

( * ) Notice: Subject to any disclaimer, the term of this patent is extended or adjusted under 35 U.S.C. 154(b) by 568 days.

This patent is subject to a terminal disclaimer.

(21) Appl. No.: 12/820,489

(22) Filed: Jun. 22, 2010

(65) Prior Publication Data

US 2010/0258542 A1    Oct. 14, 2010

Related U.S. Application Data

(63) Continuation-in-part of application No. 12/357,277, filed on Jan. 21, 2009, which is a continuation-in-part of application No. 12/049,159, filed on Mar. 14, 2008, now abandoned.

(60) Provisional application No. 61/022,232, filed on Jan. 18, 2008, provisional application No. 61/022,240, filed on Jan. 18, 2008.

(51) Int. Cl.
*H01L 21/02* (2006.01)

(52) U.S. Cl.
USPC .................. 438/59; 438/62; 257/E31.027

(58) Field of Classification Search
USPC .............. 438/59–62, 82–99; 257/E31.027
See application file for complete search history.

(56) References Cited

U.S. PATENT DOCUMENTS

| 2,218,913 A | 10/1940 | Hughes et al. |
| 3,810,786 A | 5/1974 | Lindgren |

(Continued)

FOREIGN PATENT DOCUMENTS

| JP | 54-076446 | 6/1979 |
| JP | 59-165470 | 9/1984 |

(Continued)

OTHER PUBLICATIONS

Corneille, et al., "Smoothing a Metallic Substrate for a Solar Cell," U.S. Appl. No. 12/049,159, filed Mar. 14, 2008.

(Continued)

*Primary Examiner* — Michael Lebentritt
(74) *Attorney, Agent, or Firm* — Weaver Austin Villeneuve & Sampson LLP

(57) ABSTRACT

Provided herein are methods of polishing, cleaning and texturing back contacts of thin-film solar cells. According to various embodiments, the methods involve irradiating sites on the back contact with laser beams to remove contaminants and/or smooth the surface of the back contact. The back contact, e.g., a molybdenum, copper, or niobium thin-film, is smoothed prior to deposition of the absorber and other thin-films of the photovoltaic stack. In certain embodiments, laser polishing of the back contact is used to enhance the diffusion barrier characteristics of the back contact layer, with all or a surface layer of the back contact becoming essentially amorphous. In certain embodiments, the adhesion of the absorber layer is enhanced by the textured back contact and by the presence of the amorphous metal at the deposition surface.

20 Claims, 17 Drawing Sheets

(56) References Cited

U.S. PATENT DOCUMENTS

| | | |
|---|---|---|
| 3,952,180 A | 4/1976 | Gnanamuthu |
| 4,015,100 A | 3/1977 | Gnanamuthu et al. |
| RE29,815 E | 10/1978 | Gnanamuthu |
| 4,122,240 A | 10/1978 | Banas et al. |
| 4,328,390 A | 5/1982 | Meakin et al. |
| 4,639,543 A | 1/1987 | Fang |
| 4,646,479 A | 3/1987 | Walker et al. |
| 4,731,516 A | 3/1988 | Noguchi et al. |
| 4,789,438 A | 12/1988 | Polan |
| 4,861,407 A | 8/1989 | Volkmann et al. |
| 4,968,383 A | 11/1990 | Volkmann et al. |
| 5,038,950 A | 8/1991 | Yahagi |
| 5,142,778 A | 9/1992 | Smolinski et al. |
| 5,232,674 A | 8/1993 | Mukai et al. |
| 5,287,622 A | 2/1994 | Terai |
| 5,407,702 A | 4/1995 | Smith et al. |
| 5,532,520 A | 7/1996 | Haraguchi |
| 5,558,759 A | 9/1996 | Pudem |
| 5,821,597 A | 10/1998 | Nakajima et al. |
| 5,843,117 A | 12/1998 | Alt et al. |
| 5,935,307 A | 8/1999 | Parks |
| 6,048,255 A | 4/2000 | Kuo et al. |
| 6,113,753 A | 9/2000 | Washburn |
| 6,143,095 A | 11/2000 | Kim et al. |
| 6,156,997 A | 12/2000 | Yamazaki |
| 6,205,830 B1 | 3/2001 | Voges |
| 6,249,503 B1 | 6/2001 | Aratani |
| 6,251,002 B1 | 6/2001 | Close |
| 6,262,962 B1 | 7/2001 | Aratani |
| 6,269,067 B1 | 7/2001 | Aratani |
| 6,272,083 B1 | 8/2001 | Aratani |
| 6,356,524 B2 | 3/2002 | Aratani |
| 6,492,615 B1 | 12/2002 | Flanagan |
| 6,501,725 B2 | 12/2002 | Aratani |
| 6,504,127 B1 | 1/2003 | McGregor et al. |
| 6,521,862 B1 | 2/2003 | Brannon |
| 6,700,096 B2 | 3/2004 | Yamazaki et al. |
| 6,717,105 B1 | 4/2004 | Okamoto et al. |
| 6,733,931 B2 | 5/2004 | Voutsas et al. |
| 6,852,012 B2 | 2/2005 | Vepa et al. |
| 6,887,124 B2 | 5/2005 | Pinson et al. |
| 6,908,362 B2 | 6/2005 | Selvamanickam et al. |
| 6,944,195 B2 | 9/2005 | Yamazaki et al. |
| 7,053,294 B2 | 5/2006 | Tuttle et al. |
| 7,081,043 B2 | 7/2006 | Koh et al. |
| 7,095,762 B2 | 8/2006 | Yamazaki |
| 7,139,633 B2 | 11/2006 | Mazumder et al. |
| 7,169,286 B2 | 1/2007 | Qiao |
| 7,192,479 B2 | 3/2007 | Mitani et al. |
| 7,207,862 B2 | 4/2007 | Nabeya et al. |
| 7,504,604 B2 | 3/2009 | Rossopoulos et al. |
| 7,629,234 B2 | 12/2009 | Bruland |
| 7,737,054 B2 | 6/2010 | Yamazaki et al. |
| 7,903,336 B2 | 3/2011 | Pelsue et al. |
| 7,947,575 B2 | 5/2011 | Dunne et al. |
| 8,070,557 B2 | 12/2011 | Kojima et al. |
| 8,212,139 B2 | 7/2012 | Meyer |
| 2001/0010676 A1 | 8/2001 | Aratani |
| 2001/0019532 A1 | 9/2001 | Aratani |
| 2001/0021159 A1 | 9/2001 | Aratani |
| 2001/0021166 A1 | 9/2001 | Aratani |
| 2001/0043545 A1 | 11/2001 | Aratani |
| 2002/0193870 A1 | 12/2002 | Jang |
| 2003/0019853 A1 | 1/2003 | Hayen et al. |
| 2003/0068518 A1 | 4/2003 | Ando et al. |
| 2004/0069751 A1 | 4/2004 | Yamazaki et al. |
| 2005/0038551 A1 | 2/2005 | Mazumder et al. |
| 2005/0074915 A1 | 4/2005 | Tuttle et al. |
| 2005/0081367 A1 | 4/2005 | Lauinger et al. |
| 2005/0252894 A1 | 11/2005 | Imai et al. |
| 2006/0081573 A1 | 4/2006 | Wissenbach et al. |
| 2006/0091546 A1 | 5/2006 | Bostanjogio et al. |
| 2006/0166470 A1 | 7/2006 | Tanaka |
| 2007/0036994 A1 | 2/2007 | Andre et al. |
| 2007/0158315 A1 | 7/2007 | Tanaka et al. |
| 2007/0240325 A1 | 10/2007 | Pelsue et al. |
| 2008/0009093 A1 | 1/2008 | Chung et al. |
| 2008/0196756 A1 | 8/2008 | Basol et al. |
| 2008/0223832 A1 | 9/2008 | Song et al. |
| 2008/0264910 A1 | 10/2008 | Kashyap et al. |
| 2008/0280541 A1 | 11/2008 | Chou et al. |
| 2009/0078313 A1 | 3/2009 | Basol et al. |
| 2009/0183760 A1 | 7/2009 | Meyer |
| 2009/0183763 A1 | 7/2009 | Meyer |
| 2009/0183764 A1 | 7/2009 | Meyer |
| 2009/0229666 A1 | 9/2009 | Corneille et al. |
| 2009/0266399 A1 | 10/2009 | Basol et al. |
| 2009/0305449 A1 | 12/2009 | Bollman et al. |
| 2010/0131108 A1 | 5/2010 | Meyer |
| 2010/0212720 A1 | 8/2010 | Meyer et al. |
| 2010/0255630 A1* | 10/2010 | Meyer et al. ............... 438/84 |
| 2010/0258158 A1 | 10/2010 | Meyer et al. |
| 2010/0258173 A1 | 10/2010 | Laia et al. |
| 2010/0258185 A1* | 10/2010 | Meyer et al. ............... 136/256 |
| 2010/0258542 A1* | 10/2010 | Meyer et al. ............ 219/121.66 |
| 2010/0258982 A1* | 10/2010 | Meyer et al. ............... 264/446 |
| 2010/0282276 A1 | 11/2010 | Kueper et al. |
| 2010/0282293 A1 | 11/2010 | Meyer et al. |
| 2010/0308441 A1 | 12/2010 | Chung et al. |
| 2012/0204935 A1 | 8/2012 | Meyer et al. |
| 2012/0234374 A1 | 9/2012 | Meyer |

FOREIGN PATENT DOCUMENTS

| | | |
|---|---|---|
| JP | 04182020 | 6/1992 |
| JP | 07188737 | 7/1995 |
| JP | 2001-177136 | 6/2001 |
| JP | 2002-289888 | 10/2002 |
| JP | 2006-005021 | 1/2006 |
| WO | 2005/050709 | 6/2005 |
| WO | 2010/120669 | 10/2010 |

OTHER PUBLICATIONS

Laia, et al., "Polishing a Thin Metallic Substrate for a Solar Cell," U.S. Appl. No. 12/422,620, filed Apr. 13, 2009.

Meyer, et al., "Laser polishing of a solar cell substrate," U.S. Appl. No. 12/820,455, filed Jun. 22, 2010.

Meyer, et al., "Textured substrate for a solar cell,", U.S. Appl. No. 12/820,522, filed Jun. 22, 2010.

Meyer, et al., "Sodium-Incorporation In Solar Cell Substrates and Contacts," U.S. Appl. No. 12/820,560, filed Jun. 22, 2010.

Kueper, et al, "Removing Defects From Photovoltaic Cell Metallic Substrates With Fixed-Abrasive Filament Roller Brushes," U.S. Appl. No. 12/842,865, filed Jul. 23, 2010.

International Search Report and Written Opinion mailed Nov. 19, 2010, patent application No. PCT/US2010/030694.

International Search Report and Written Opinion mailed Sep. 23, 2009, patent application No. PCT/US2009/035328.

Office Action mailed Oct. 5, 2011 for U.S. Appl. No. 12/049,159.

Bereznai et al., "Surface Modifications Induced by Ns and Sub-Ps Excimer Laser Pulses on Titanium Implant Material," Biomaterials, 2003, vol. 24, pp. 4197-4203.

Brinksmeier, et al., "Polishing of Structured Molds," CIRP Annals—Manufacturing Technology, 2004, vol. 53, Issue 1, pp. 247-250.

Shai et al., "An Approach to Modelling of Laser Polishing of Metals," Surface & Coatings Technology, 2005, vol. 197, pp. 77-84.

Final Office Action mailed Apr. 12, 2012 for U.S. Appl. No. 12/049,159.

Office Action mailed Jun. 15, 2012 for U.S. Appl. No. 12/422,620.

Office Action mailed Jan. 31, 2013 for U.S. Appl. No. 12/820,455.

Lowndes et al, "Smooth Polycrystalline Ceramic Substrates with Enhanced Metal Adhesion by Pulsed Excimer Laser Processing," Applied Physics Letters, 64, 14, 1994, pp. 1791-1793.

Dobrzanski, et al., "Development of the Laser Method of Multicrystalline Silicon Surface Texturization," Archives of Materials Science and Engineering, vol. 38, No. 1, 2009, pp. 5-11.

Dobrzanski, et al., "Laser Texturization in Technology of Mulicrystalline Silicon Solar Cells," Archives of Materials Science and Engineering, vol. 29, No. 1, 2008, pp. 7-14.

Dobrzanski, et al., "Surface Texturing of Multicrystalline Silicon Solar Cells," Archives of Materials Science and Engineering, vol. 31, No. 1, 2008, pp. 77-82.

Ramos, et al., "Surface Over-Melt During Laser Polishing of Indirect- SLS Metal Parts," Materials Research Society Symposium Proceedings, vol. 758, 2002, pp. 53-61.

Perry et al., "Pulsed Laser Polishing of Micro-Milled Ti6A14V Samples," Journal of Manufacturing Processes, vol. 11, 2009, pp. 74-81.

Guo, Wei, Effect of Irradiation Parameters on Morphology of Polishing DF1 (AISI-01) Surface by Nd:YAG Laser, Research Letters in Materials Science, 2007, 5 pages.

Willenborg et al., "Polishing Metals with Laser Radiation," Industrial Laser Solutions, 2009, pp. 9-13.

Office Action mailed Jan. 2, 2013 for U.S. Appl. No. 12/820,560.

Office Action mailed Aug. 22, 2012 for U.S. Appl. No. 12/842,865.

* cited by examiner

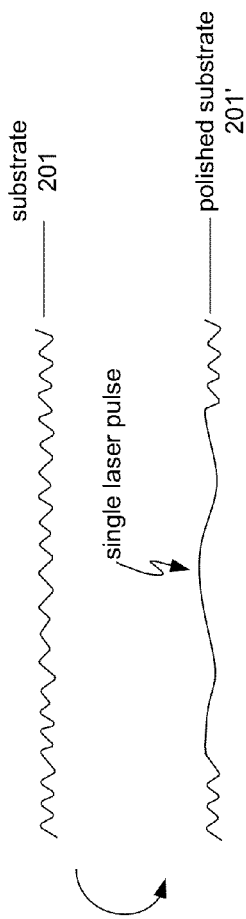
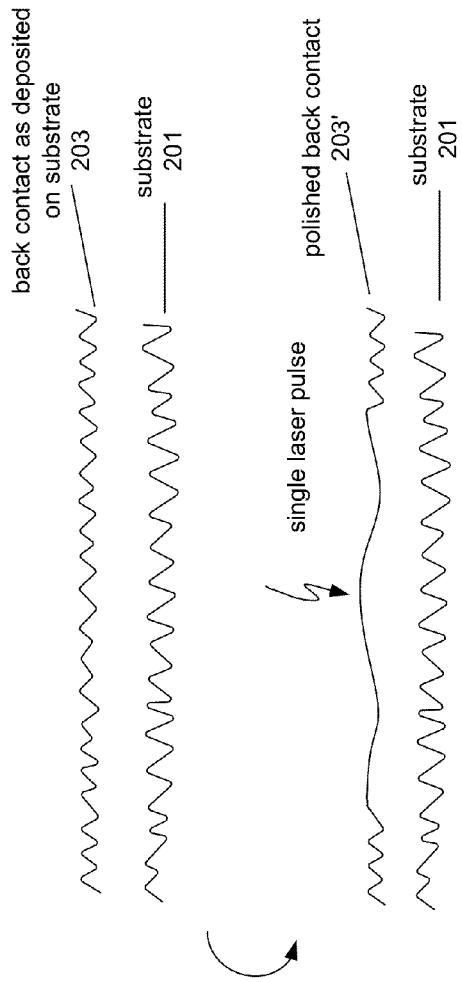

LASER POLISHING OF A BACK CONTACT OF A SOLAR CELL

CROSS-REFERENCE TO RELATED APPLICATIONS

This application is a continuation-in-part of U.S. patent application Ser. No. 12/357,277, filed Jan. 21, 2009, which claims benefit of the following: U.S. Provisional Patent Application No. 61/022,232, filed Jan. 18, 2008 and U.S. Provisional Patent Application No. 61/022,240, filed Jan. 18, 2008. This application is also a continuation-in-part of U.S. patent application Ser. No. 12/049,159, filed Mar. 14, 2008. Each of these applications is incorporated by reference herein for all purposes.

BACKGROUND

Solar cells are widely used to collect solar energy and generate electricity, with multiple solar cells interconnected to form solar panels. There are two main types of solar collectors: silicon and thin-film solar collectors. Silicon is currently the predominant technology, using silicon-based cells encapsulated behind glass. Thin-film processes involve depositing thin-film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current throughout the cell.

In one example of a fabrication process, a metallic back electrical contact layer is deposited on a substrate. A p-type semiconductor layer is then deposited on the back electrical contact layer and an n-type semiconductor layer is deposited on the p-type semiconductor layer to complete a p-n junction. Any suitable semiconductor materials, such as CIGS, CIS, CdTe, CdS, ZnS, ZnO, amorphous silicon, polycrystalline silicon, etc. may be used for these layers. A top transparent electrode layer is then deposited on the p-n junction. This layer may be a conductive oxide or other conductive film and is used for current collection. Once these or other materials have been deposited on the substrate to form a photovoltaic stack, the substrate and thin-film materials deposited may be cut into cells. Multiple cells are then assembled into a thin-film solar panel.

Thin-film solar collectors are lower cost and require lower energy to produce. However, there are numerous sources of defects in a thin-film panel, given the materials used, the large surfaces areas required, the small thicknesses of films, and the sensitivity of the films to small particles. For example, a one micron particle is on the order of the film thickness. Defects from particles and other sources can cause shunts and otherwise compromise solar cell performance.

SUMMARY

Provided herein are methods of polishing, cleaning and texturing back contacts of thin-film solar cells. According to various embodiments, the methods involve irradiating sites on the back contact with laser beams to remove contaminants and/or smooth the surface of the back contact. The back contact, e.g., a molybdenum, copper, or niobium thin-film, is smoothed prior to deposition of the absorber and other thin-films of the photovoltaic stack. In certain embodiments, laser polishing of the back contact is used to enhance the diffusion barrier characteristics of the back contact layer, with all or a surface layer of the back contact becoming essentially amorphous. In certain embodiments, the adhesion of the absorber layer is enhanced by the textured back contact and by the presence of the amorphous metal at the deposition surface.

One aspect of the invention relates to a method of polishing a back contact of a thin-film photovoltaic stack. The method involves providing a substrate having a back contact layer for a thin-film photovoltaic stack deposited thereon; and polishing a front surface of the back contact layer by forming surface features in the front surface, wherein forming surface features comprises rastering one or more laser beams over the front surface. The back contact layer may be molybdenum, niobium, copper and silver or any other thin-film capable of making ohmic contact. The substrate may be a metal substrate, e.g., a stainless steel foil.

In certain embodiments, the method involves depositing one or more thin-film layers configured to absorb solar energy on the polished back contact. Examples of absorber layers include CIGS or CIS. In certain embodiments, rastering one or more laser beams over the front surface increases the amorphous character of the back contact layer, and may include improving the diffusion barrier characteristics of the back contact and/or increasing adhesion of the absorber layer to the back contact.

In certain embodiments, the substrate is providing as a web. Polishing a front surface of the back contact layer may involve forming multiple rows of surface features in the front surface, wherein forming a row of surface features comprises rastering one or more laser beams over the front surface in a cross-web direction. The surface features of the row may overlap with the surface features of each adjacent row.

In certain embodiments, the back contact is about 0.5 microns thick. In alternate embodiments, the back contact is between about 1 and 5 microns thick. In certain embodiments, the back contact thickness is at least about 5 microns to allow texturing and polishing depths of this size. According to various embodiments, the substrate may or may not be polished by laser polishing or other techniques prior to deposition of the back contact.

In certain embodiments, the polishing or texturing methods described herein involve irradiating a front surface of the back contact layer with laser energy to heat the surface in localized areas of between 5 to 200 microns and form a plurality of shallow, rapidly expanding melt pools; and after forming the melt pools, cooling the front surface to form a smoothed surface. Irradiating the front surface with laser energy may involve exposing the front surface to laser beams at a rate of about 10-1000 kHz. The smoothed surface may be characterized by a pattern of interconnected surface features, said features having a frequency of 1-200 microns. The interconnected surface features may have an average maximum aspect ratio of no more than 1:1, in certain embodiments, substantially smaller than 1:1, e.g., 0.5:1, etc. Also in certain embodiments, the substrate is oriented at an angle of no more than 10° from vertical during the irradiation.

These and other aspects of the invention are discussed in further detail below with reference to the figures.

BRIEF DESCRIPTION OF THE DRAWINGS

The accompanying drawings, which are incorporated in and form a part of this specification, illustrate embodiments of the invention and, together with the description, serve to explain the embodiments of the invention:

FIG. 2A depicts a schematic illustration of laser polishing of a substrate of a thin-film photovoltaic stack according to certain embodiments.

FIG. 2B depicts a schematic illustration of laser polishing of a back contact of a thin-film photovoltaic stack according to certain embodiments.

DESCRIPTION OF EMBODIMENTS

Figure 1:
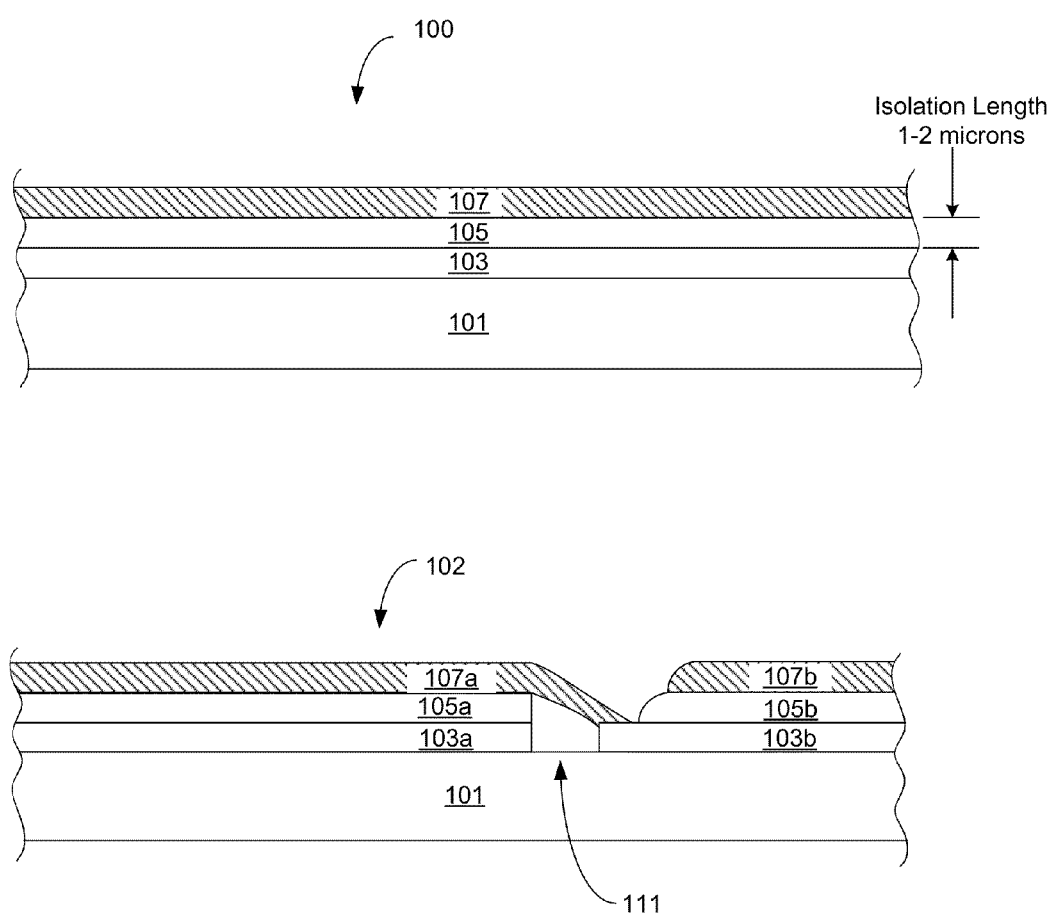
FIG. 1 depicts schematic illustrations of a thin-film solar cell and two monolithically integrated thin-film solar cells according to certain embodiments.

Thin-film solar panels have many advantages, including providing low cost, low energy production. However, there are numerous sources of defects in a thin-film panel, given materials used, the large surfaces areas required, the small thicknesses of films, and the sensitivity of the films to small particles. For example, a one micron particle is on the order of the film thickness. Defects from particles and other causes can cause shunts and otherwise compromise solar cell performance.

Another factor related to defects is the level of substrate preparation. For semiconductor device fabrication, substrate (semiconductor wafer) preparation involves chemical-mechanical planarization and cleaning prior to wafers being released into the line. In media production, near sub-single nanometer polish levels are achieved. However, these techniques are highly complex and expensive in comparison to what can reasonably be done as pre-preparation prior to film deposition for a large area solar panel. Any large area, economical method of substrate preparation is likely to leave some level of high-frequency roughness, in comparison to the film thickness. As a result, any robust and high yielding thin-film solar product has a certain number of defects accounted for in the product and process design. Unlike wafer flatness requirements for photolithography, probing and other concerns, and magnetic media for spacing control, there are no significant waviness or flatness requirements for large area photovoltaic panels.

However, defects and particles should be minimized as they can cause shunts between the top and back contacts of a photovoltaic stack. Shunt sites may be present on fabrication or can develop during the lifetime of a solar panel. This development can be related to moisture ingress, collection of ionic contaminants, changes in stress/strain in the film or package or thermal cycling. A new site near a collection line can sink nearly all current generated in a typical cell, and can actually melt the encapsulating material, allowing for additional environmental degradation. The use of serialized cell strings where the voltages are increased across an individual cell place even greater stresses on defect sites and film continuity, the opportunity for field damage to occur in a shaded or poor performing cell. In addition to shunt sites, other problematic results of film defects include low film performance due to poor junction formation and film delamination.

Provided herein are methods of laser polishing, texturing and cleaning thin-film photovoltaic materials. Laser polishing as described herein refers to smoothing a surface of a substrate or back contact layer by exposing one or more localized areas or sites of the surface to laser irradiation, thereby creating a melt pool centered on the site of irradiation, and allowing the melted surface material to re-solidify. In certain embodiments, high frequency surface roughness is removed. In certain embodiments, surface waviness is removed.

Laser texturing as described herein refers to a process of exposing a surface of a substrate or back contact layer to laser irradiation to create a surface pattern having long range order. Long range order refers to a substantially uniform pattern over a surface area of at least tens of square feet. In certain embodiments, laser texturing involves forming an interconnected low frequency patterned surface, the pattern surface frequency being between about 5 and 200 microns. In certain embodiments, the surface is provided having textured features from a rolling or other process. Such a surface may be retextured using laser irradiation. In certain embodiments, a laser textured surface may be characterized by one or more of: overlapping features, a substantially uniform array of features having a center-to-center distance of between about 5 and 200 microns, a substantially uniform array of features having circular symmetry, a substantially uniform array of features having non-circular symmetry, or a substantially uniform array of features having a center-to-center distance less than the natural length scale of the features. Laser texturing may involve rastering a laser beam in a first direction, while moving the surface in a second direction, such that features are formed across a surface at a 100-1000 kHz repetition rate.

Laser cleaning as described herein refers to a process of removing organic or inorganic contamination from a surface of a substrate or back contact. The contamination may be in the form of discrete particles or may be in the form of smeared material.

According to various embodiments, the methods involve removing defects from a material surface by rapidly heating the surface in an area of about 5-200 microns to form shallow (about 10-1000 angstroms deep) and rapidly expanding melt pools, followed by rapid cooling of the surface. The minimization of surface tension causes the surface to re-solidify in a locally smooth surface. That is, high frequency roughness is smoothed out, with a lower frequency bump or texture pattern remaining in certain embodiments after resolidification. Cooling of the surface may be active or passive according to various embodiments.

FIG. 1 includes a not-too-scale schematic of a thin-film photovoltaic stack 100 of a photovoltaic cell. Substrate 101 supports thin-film layers 103, 105 and 107. For the purposes of illustration, the figure is not to scale; for example, thickness of the substrate 101 may be on the order of mils, the thickness of the thin-film stack on the order of microns (or hundredths of mils). Substrate 101 may be a metallic or polymeric material. According to various embodiments, the substrate 101 is relatively thin, such as for example, between about 2-100 mils, or in certain embodiments, 2-10 mils. However, other suitable thicknesses may also be used, e.g., 50 mils. Back electrical contact layer 103 provides electrical contact to allow electrical current to flow through the photovoltaic cell, and may be made of any appropriate material, e.g., molybdenum, niobium, copper, silver, etc. Layer 107 is a top transparent electrode layer. In certain embodiments, it is a transparent conducting oxide (TCO), for example, zinc oxide, aluminum-doped zinc oxide and indium tin oxide. Layer 105 represents several thin-films deposited between back electrical contact layer 103 and top transparent electrical contact layer 107, including a p-n junction. To form the p-n junction, a p-type semiconductor layer is deposited on back electrical contact layer 103 and an n-type semiconductor layer is deposited on the p-type semiconductor layer. According to various embodiments, any suitable semiconductor materials, such as CIGS, CIS, CdTe, CdS, ZnS, ZnO, amorphous silicon, polycrystalline silicon, etc. are used to form the p-n junction. For example, the p-type semiconductor layer may be CIGS or CIS, and the n-type semiconductor layer may be CdS or a cadmium free material, such as ZnS, ZnO, etc. Embodiments of the invention are not limited to these p-n junctions, but include any appropriate p-n junction produced either as a homojunction in a single semiconductor material, or alternatively as a heterojunction between two different semiconductor materials.

According to various embodiments, other thin-film layers may be deposited between the electrical contact layers 103 and 107. As an example, electrical contact layers 103 and 107 are separated by a distance of about 1-2 microns. Any ionic contamination and moisture, cutting defects (for non-monolithically integrated cells), conductive contamination, or film delamination can lead to shunting sites, resulting in manufacturing or latent defects. In particular, the presence of any defect in the substrate may cause shunting at the time of deposition, or make the stack susceptible to developing shunts.

FIG. 1 also depicts a not-to-scale schematic illustration of two monolithically integrated stacks at 102. In this example, a first stack including thin-film layers 103a, 105a and 107a is electrically connected to a second stack including thin-film layers 103b, 105b and 107b at a site 111, with top contact layer 107a and back contact 103b separated into interconnected sections. The site 111 of film discontinuities is a likely point of moisture ingress, which can lead to shunting.

While there are various possible sources and causes of shunting and related defects, methods and apparatuses according to various embodiments remove or reduce a significant number of such causes. The photovoltaic thin-film stacks depicted in FIG. 1 are deposited on a section of a substrate 101 after it has been polished, and contains no substantial defects, particles, or areas of high roughness. As such no shunting between the top contact layer 107 and metal contact layer 103 and/or substrate 101 is observed.

Figure 2C:
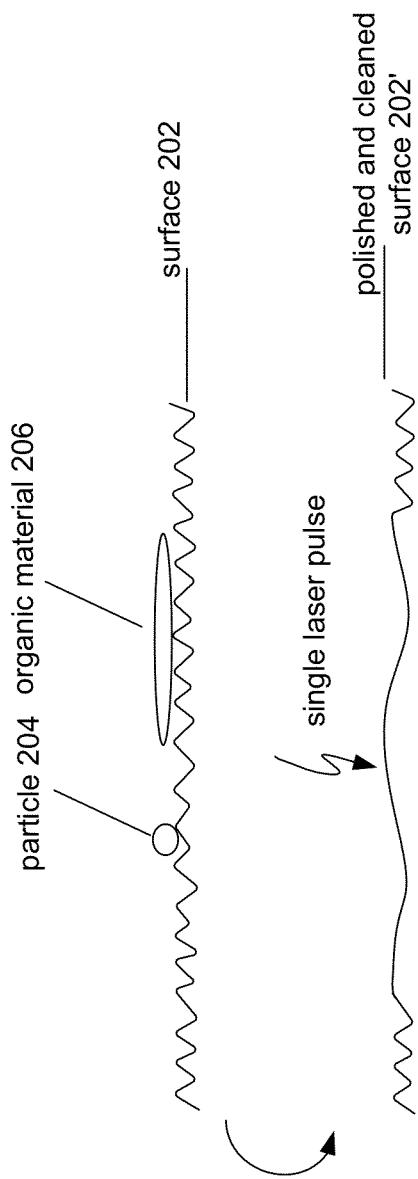
FIG. 2C depicts a schematic illustration of laser cleaning of a surface of a layer in a thin-film photovoltaic stack according to certain embodiments.

FIGS. 2A-2C depict examples of laser polishing according to various embodiments by directing a pulsed laser beam to one or more sites on a surface. First, in FIG. 2A, a substrate surface 201 is depicted. The substrate may be a metal foil, such as a stainless steel foil, or a polymeric material. In certain embodiments, the substrate material is a homogenous or non-homogenous composition of one or more metals, including steel, stainless steel, aluminum or titanium. In another embodiment, the substrate is a polyimide material. Substrate surface 201 is a normal appearing material surface after mechanical processing such as mechanical rolling, that is it contains high frequency roughness. To polish the substrate, a single laser pulse is directed at the surface. The absorbed energy creates a local melted region on the surface. This melted region expands, and a wave begins to move outward from the irradiated spot. Because the substrate is highly conductive, the thermal energy is lost quickly, resulting in a surface as depicted at 201'. The resulting surface feature represents a close approximation to a constant volume process. Because the material reaches a liquid state during the polishing process, any high frequency roughness (as present in surface 201) or other short wavelength features are lost due to the minimization of surface energy during the transitory liquid phase. The resultant lower frequency (longer wavelength) roughness is appropriate for film deposition and photovoltaic applications. The slope of the raised feature in polished surface 201' created by the laser pulse is much less than the slopes of the unpolished features in 201. FIG. 2B depicts a substrate surface 201 coated with an as-deposited back contact surface 203. In the example shown, the substrate surface is not polished prior to depositing the back contact layer, though in other embodiments, the methods involve laser polishing the substrate surface prior to deposition of the back contact layer in addition to laser polishing the back contact layer surface. As described above, the back contact may be molybdenum, niobium, chromium, or others, or combinations of these. FIG. 2B also shows the back contact surface 203' after a laser pulse treatment. In certain embodiments, the thickness of the back contact is sufficient to maintain the laser process within the back contact. For example, depending on the laser pulse energy, a back contact layer thickness of about 1-5 microns is sufficient to prevent the laser energy from affecting the underlying substrate surface.

In addition to retexturing the surface, the laser polishing process cleans the surface in certain embodiments. This is depicted in FIG. 2C, which shows a particle 204 and an organic smear 206 on a surface 202. Surface 202 may be a substrate surface or a back contact surface. If a 1 micron particle on a surface was left in place prior to coating the surface with a 1 micron film, significant discontinuities would be required to cover the particle. Particles larger than the overlying thickness cannot be fully covered. Both situations result in potential conductive paths to the back contact. In the methods according to certain embodiments, a single laser pulse removes the surface materials, with the polished section of the surface 202' free of them. Because the initial part of the process involves a rapid influx of heat and expansion of the surrounding surface, most surface materials are easily removed. It should be noted that for illustration, FIGS. 2A-2C are not-to-scale with the vertical scale much larger than the horizontal scale, such that the actual slopes are much shallower than they appear.

Exposing the surface to a laser beam in accordance with the embodiments described herein may be performed in air, a controlled benign environment such as a noble gas (depending on the reactivity of the surface metal to air), in a reactive gas environment for incorporating elemental compositions into the surface material. In certain embodiments, the compositions or elements are placed on the surface prior to treatment for incorporation into the material during the melt phase. This is discussed further below.

In certain embodiments, a substrate is provided in a web and thin-films are deposited on the substrate in a roll-to-roll process. According to various embodiments, the substrate is laser polished prior to the deposition of any films thereon. An example of a web path that includes laser polishing is described below with respect to FIG. 3, which shows a simplified schematic diagram illustrating a top view of a laser polishing and deposition apparatus. A web 301 of a bare substrate is shown being unspooled to enter the first deposition chamber 304. One of skill in the art will understand that the manner in which the web is fed into the chamber, the orientation of a spool holding the web, the orientation of the deposition chambers, etc., may be varied. As described below, in certain embodiments, the web is vertical or near-vertical during laser polishing.

In certain embodiments, the web material is a thin metal foil such as stainless steel, though it may be a thin polymeric material. In many embodiments, the web substrate has a width of between about 2 and 4 feet (in the direction perpendicular to the view), though the laser polishing apparatus may be configured to support substrates of any size, including sizes outside this range.

In certain embodiments, the substrate is relatively low-cost, rolled sheet stock suitable for use as metallic or non-metallic substrates. These include stainless steel, aluminum, titanium, alloys of aluminum or titanium, any metallic foil, or even a metalized non-metallic substrate. Examples of aluminum and titanium alloys include aluminum-silicon alloy and titanium-aluminum alloy, respectively; an example of a metalized non-metallic substrate is a flexible, non-conductive substrate, such as a polymer substrate, with a sputtered metallic layer; and an example of a stainless steel is 430-alloy stainless steel.

Prior to passing into the first deposition chamber 304, the deposition surface of the substrate web is irradiated with one or more laser beams at certain points on the surface at a laser polishing station 302. This causes a melt pool to form at each of these points, evening out surface roughness as well as removing any particles that may be present on the material.

After polishing, the web passes into multiple deposition chambers 304, 306 and 308, which contains one or more magnetrons and targets (not shown) for sputtering one or more thin-films on the web substrate. For example, molybdenum, copper or other back electrical contact material may be sputtered onto the substrate as it continuously moves through the deposition chamber 304. Various guide rollers (not shown) may be used to guide the web substrate through the deposition chamber as well as throughout the apparatus. In certain embodiments, a deposition chamber may include a coating drum (not shown) to support the web substrate while it moves through the deposition chamber. In general, the web is kept in constant tension throughout the machine, with rollers used as necessary to spread the web, provide web steering, provide web tension feedback to servo controllers, and to run the web in desired positions. The web then passes into the next deposition chamber 306 for further thin-film deposition. For example, a p-type CIGS layer may be deposited in this chamber. Next the web is transferred into deposition chamber 308 for deposition of the top layer or layers of the photovoltaic stack. For example, a thin layer of n-type material to form and maintain the p-n junction in coordination with the previous layer may be deposited followed by deposition of a highly conductive and transparent aluminum doped ZnO layer that completes the top electrode.

The deposition apparatus described above is an example of thin-film deposition apparatuses that may be used according to various embodiments. The number of deposition chambers used may range from one to as many as necessary to deposit the thin-film materials. The number, type and thickness of thin-films deposited in each chamber may also be varied depending on system implementation. For example, each film described above with reference to FIG. 1 may be deposited in one or more deposition chambers as appropriate. Likewise, a single deposition chamber may be used to deposit multiple types of films.

Still further, the active absorber stack deposited on the back contact layer after any of the methods described herein may include silicon (e.g. for amorphous, micro-crystalline, polycrystalline and tandem silicon cells), copper-indium-gallium-(selenium and/or sulfur), CdSe, CdTe, organic oligomers or polymers, layers of inorganic and organic materials, and whose final form may include micro-particles, nano-particles, or quantum dots.

Figure 3:
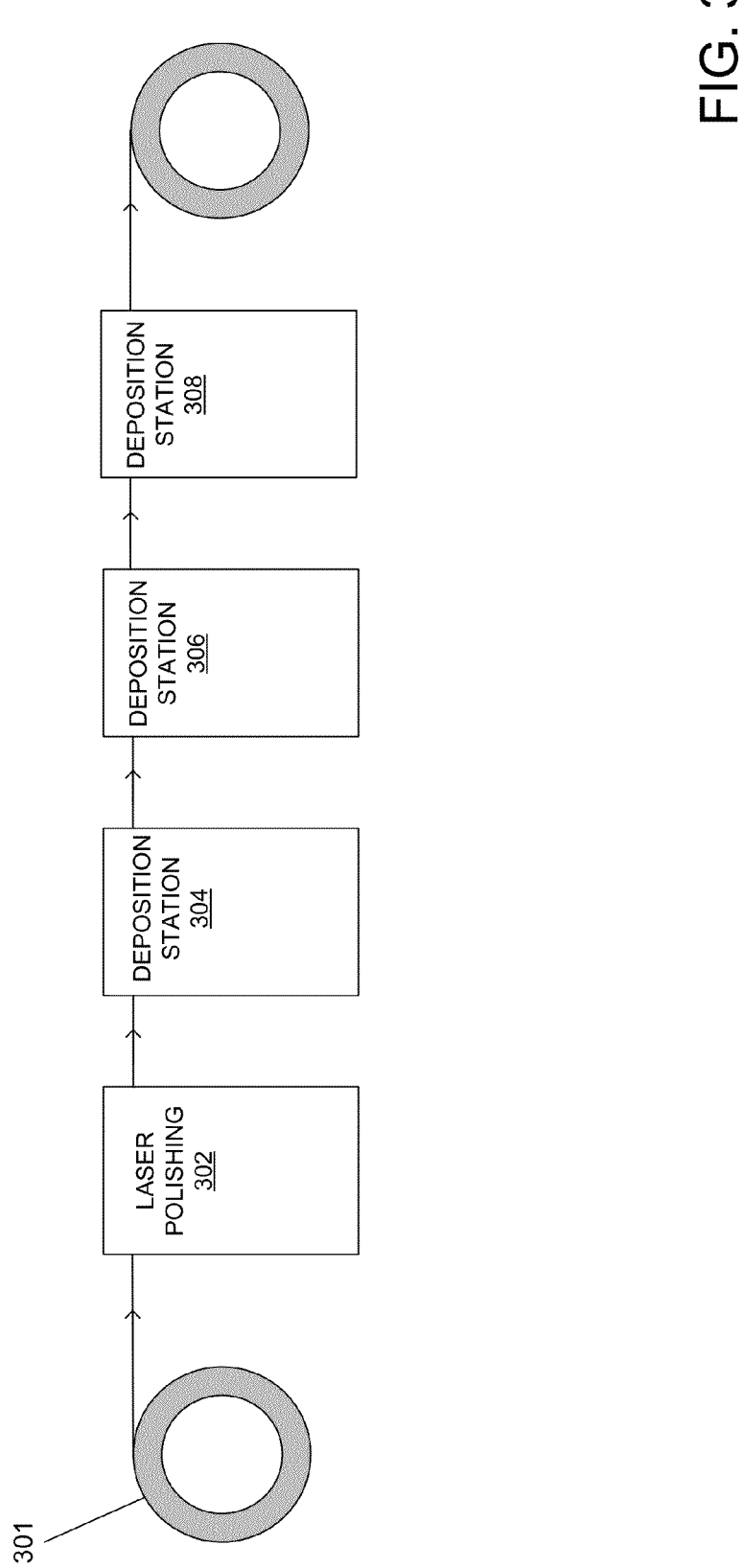
FIG. 3 is a simplified diagram showing a deposition apparatus for depositing thin film photovoltaic materials on a web substrate including a laser polishing apparatus according to certain embodiments.

While FIG. 3 provides an example of a laser polishing apparatus in the context of a thin-film deposition apparatus, one of skill in the art will understand that other the methods and apparatuses may be practiced with various modifications. For example, cut pieces of substrates may be polished rather than a substrate on a web. Also, while in certain embodiments, laser polishing is performed between unspooling of the roll and entering the deposition chamber, in other embodiments, polishing may occur at a time and/or location remote from the deposition itself and may involve spooling the polished substrate. In certain embodiments, the back contact is polished either in addition to or in lieu of the substrate being polished. This may occur within a deposition apparatus, between deposition apparatuses, etc.

The area of each irradiated site may be between about 5 and 200 microns according to certain embodiments, for example, between about 5 and 100 microns, 5 and 25 microns, 5 and 50 microns, 100 and 200 microns or 150 and 200 microns. In many embodiments, each irradiated site is a single generally circular spot, having a diameter equal to the beam diameter at the surface. The beam area is defined by a lens that directs the beam on the substrate; in certain embodiments, the lens is shaped to direct ellipsoidal or other shaped spots on the substrate.

In certain embodiments, the smoothed surface is characterized by interconnected surface features, with the features having a frequency of between about 1 and 200 microns, according to certain embodiments, for example, between about 5 and 200 microns about 5 and 100 microns, 5 and 25 microns, 5 and 50 microns, 100 and 200 microns or 150 and 200 microns. These interconnected surface features may have a maximum aspect ratio of no more than 1:1.

Pulse duration (full width half max peak power) may range from about 0.10-100 nanoseconds, e.g., 0.1-50 nanoseconds, 0.1-10 nanoseconds, or 1-10 nanoseconds. Peak pulse energy may range from about 1 microjoule to millijoules. Pulse wavelength may range from about 0.4-10 microns. These parameters may depend in part on the material surface being treated, as well as the desired textured surface that results.

Figure 4:
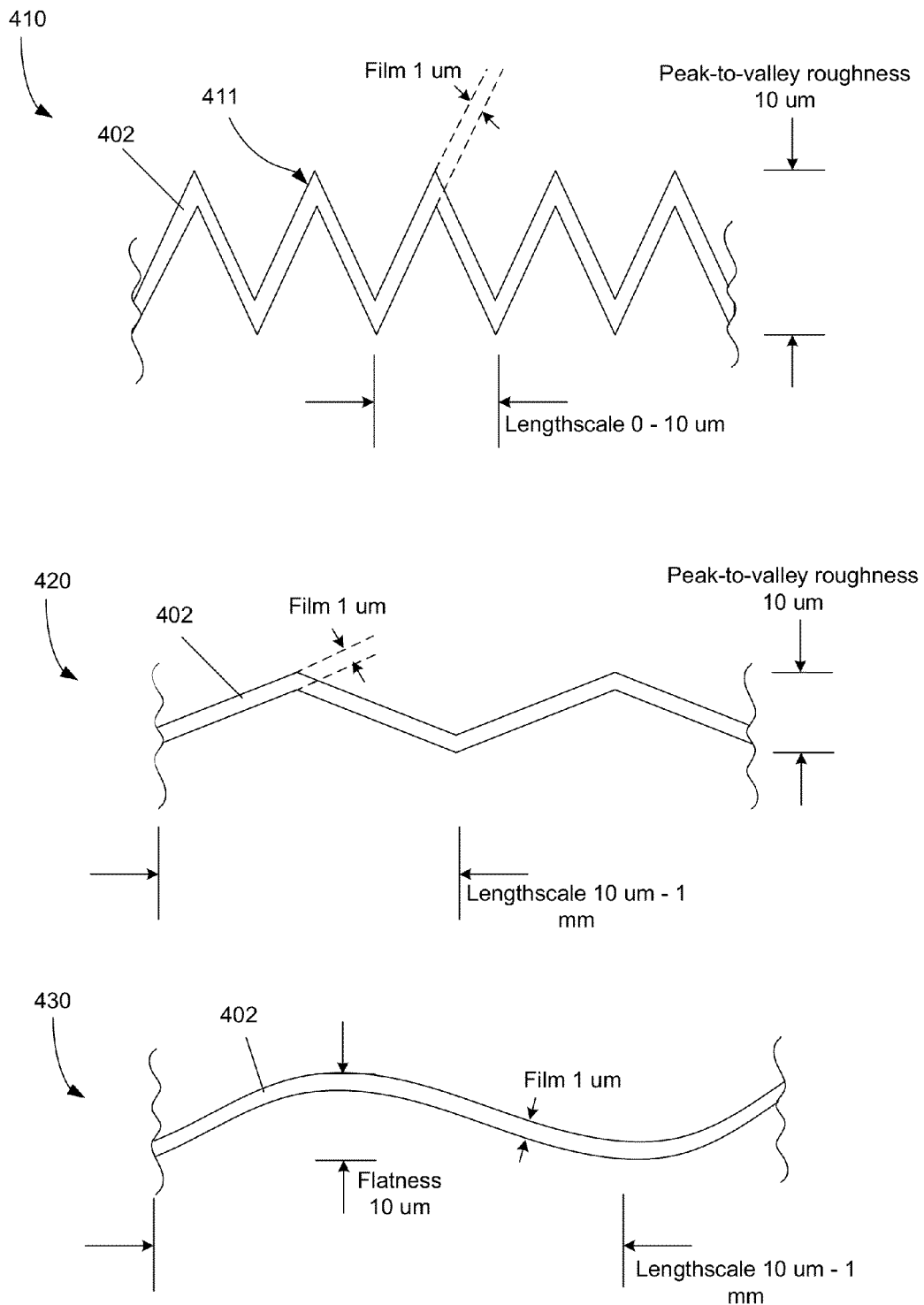
FIG. 4 depicts schematic illustrations of examples of high frequency roughness, low frequency roughness (waviness) and flatness scales of thin-film photovoltaic stacks according to certain embodiments.

In certain embodiments, methods are provided for texturing the surface of a substrate for a thin-film photovoltaic stack. In certain embodiments, methods are provided for texturing the surface of a back contact layer of a thin-film photovoltaic stack. FIG. 4 shows examples of high frequency roughness, low frequency roughness (waviness) and flatness scales. At 410, is an example of surface roughness in film 402. The images in FIG. 4 are not shown to scale with the vertical scale exaggerated for illustrative purposes. Peaks 411 are present in the film with the peak-valley roughness being on the same order as the length scale, which ranges up to 10 microns. The aspect ratios (peak to valley vertical distance) of the features (peaks 411) may be 1:1 or greater, e.g., 2:1, 3:1 or even higher. Further details of surface characteristics of as-received metallic substrates are described in U.S. Patent Publication No. 20090229666, incorporated by reference herein.

At 420, a film 402 having a lower frequency roughness (waviness) with length scales (distance between features) of greater than 10 microns. Here, the length scales are greater than the peak to valley roughness, in certain cases at least an order of magnitude greater than the peak to valley roughness. At 403, a film 402 that is "flat" with length scales often exceeding a millimeter, is depicted.

According to various embodiments, the texturing methods described herein modify surfaces having high frequency, high aspect ratio (e.g., 1:1 or above) features, retexturing them so that they exhibit only low frequency or flat features as described above. It should be noted that unlike some technologies in which photolithography, multi-step CMP planarization, fly height control and other functional requirements demand controlled long-wavelength flatness, for thin-film photovoltaics, waviness is tolerable. Only the high aspect ratio surface features are disruptive to the film.

Figure 5:
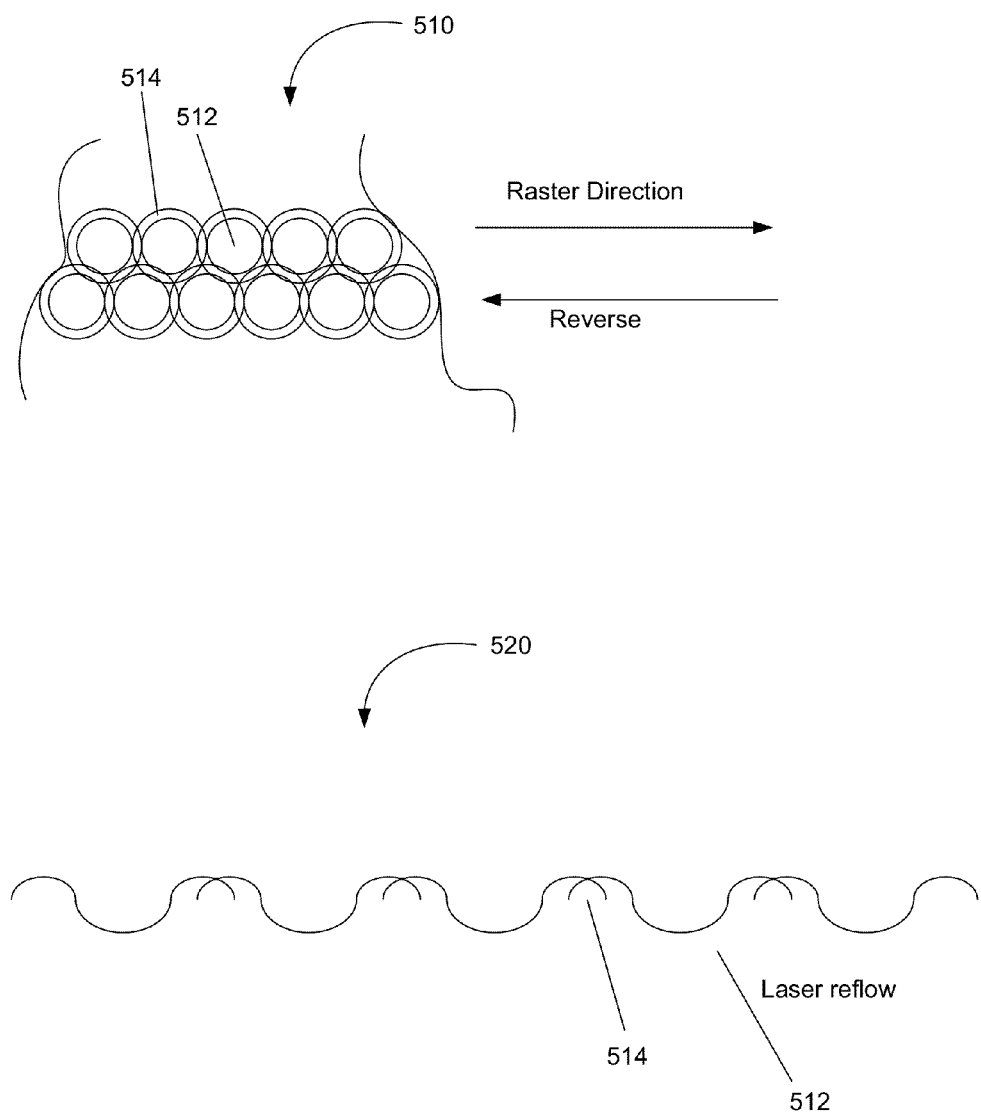
FIG. 5 depicts top and side views of an overlapping texture pattern according to certain embodiments.

In certain embodiments, overlapping texture patterns are formed by rastering one or more laser beams to irradiate multiple spots across an entire surface or a portion thereof. FIG. 5 shows an example surface having a pattern of overlapping features created by laser reflow. A plan view is shown at 510, with features 512 overlapping in area 514. A cross-sectional view is shown at 520. In the depicted example, the beam is rastered back and forth in a linear fashion to form rows of features. An off-set is applied between rows to ensure complete coverage. To create overlap, the distance between irradiation points is smaller than the length scale of the resulting features. In the example depicted in FIG. 5, the features of the substrate pattern include overlapping circular raised peripheries and a recessed center region. This is an example of an overlapping surface that may be formed.

Figure 6:
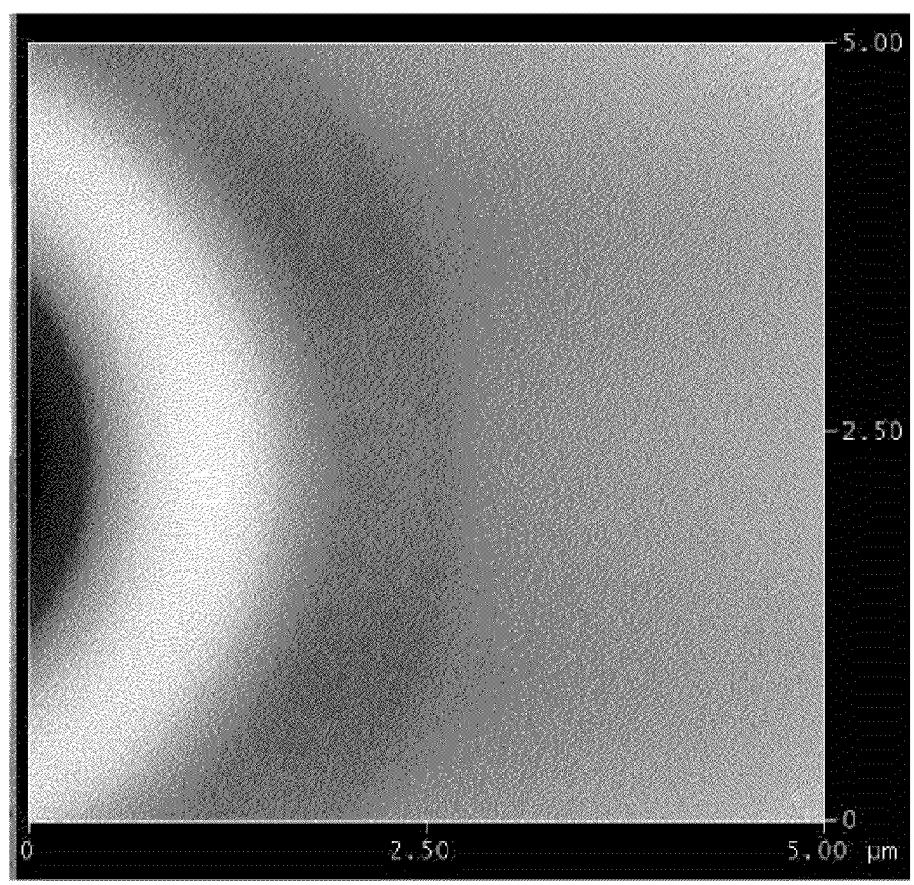
FIG. 6 is an image showing an example of a laser textured feature formed in a nickel surface.

According to various embodiments, texturing a surface of a photovoltaic stack or a substrate therefore comprises creating features having aspect ratios, or height to diameter ratios of less than about 1, less than about 0.5, less than about 0.1, less than about 0.05, less than about 0.01, or less than about 0.005. FIG. 6 is an image showing an example of a laser textured feature formed in a nickel surface. The feature has a height of 150 Angstroms and is 5 microns in diameter, a height to diameter ratio of less than 0.005. Note the long wavelength characteristics of the surface roughness, the continuity of the feature and the lack of local features in the region of the bump.

Figure 7A:
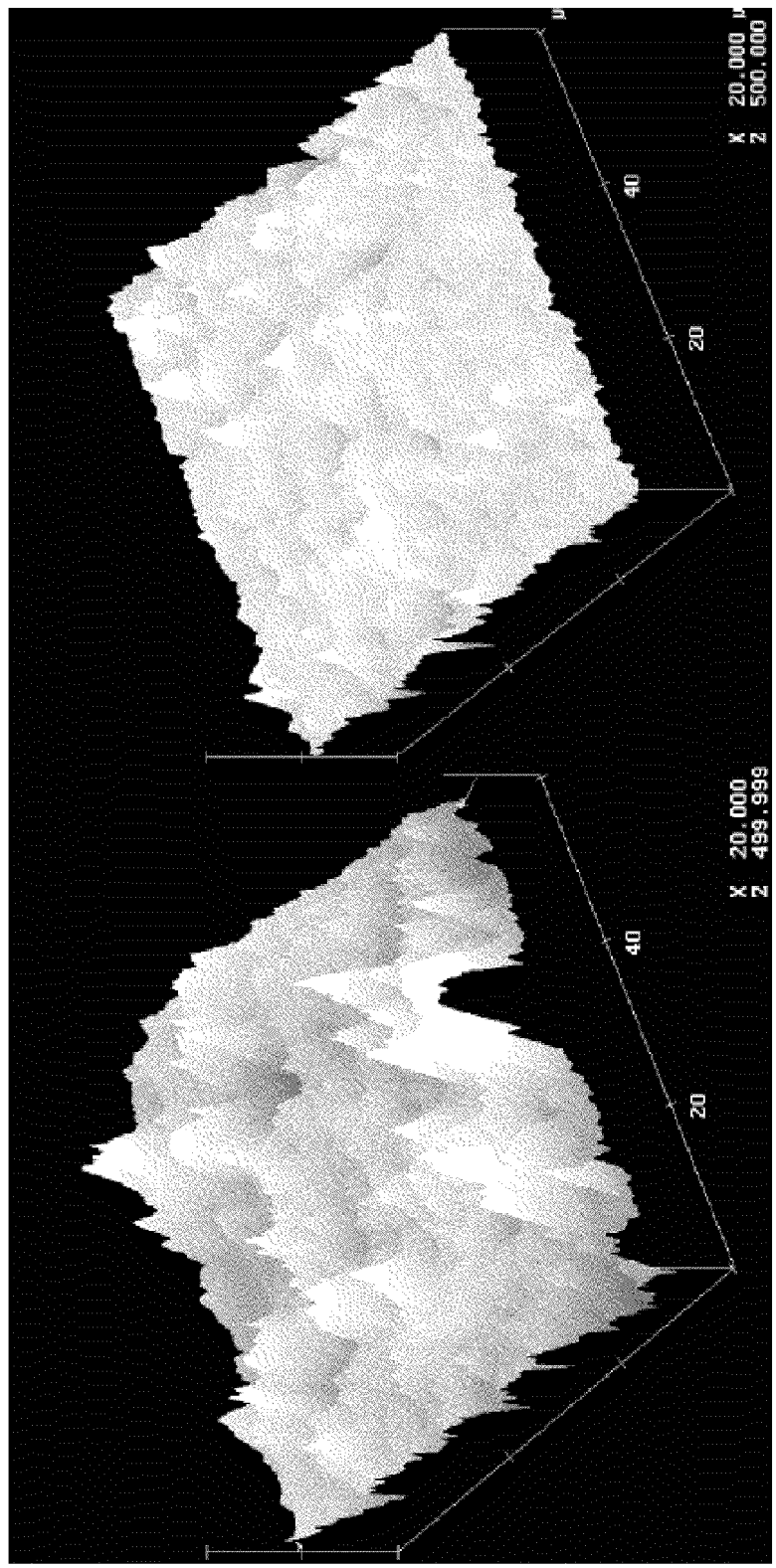
FIG. 7A shows two images of surface finishes of 300 series stainless steel surface prior to laser treatment.
Figure 7B:
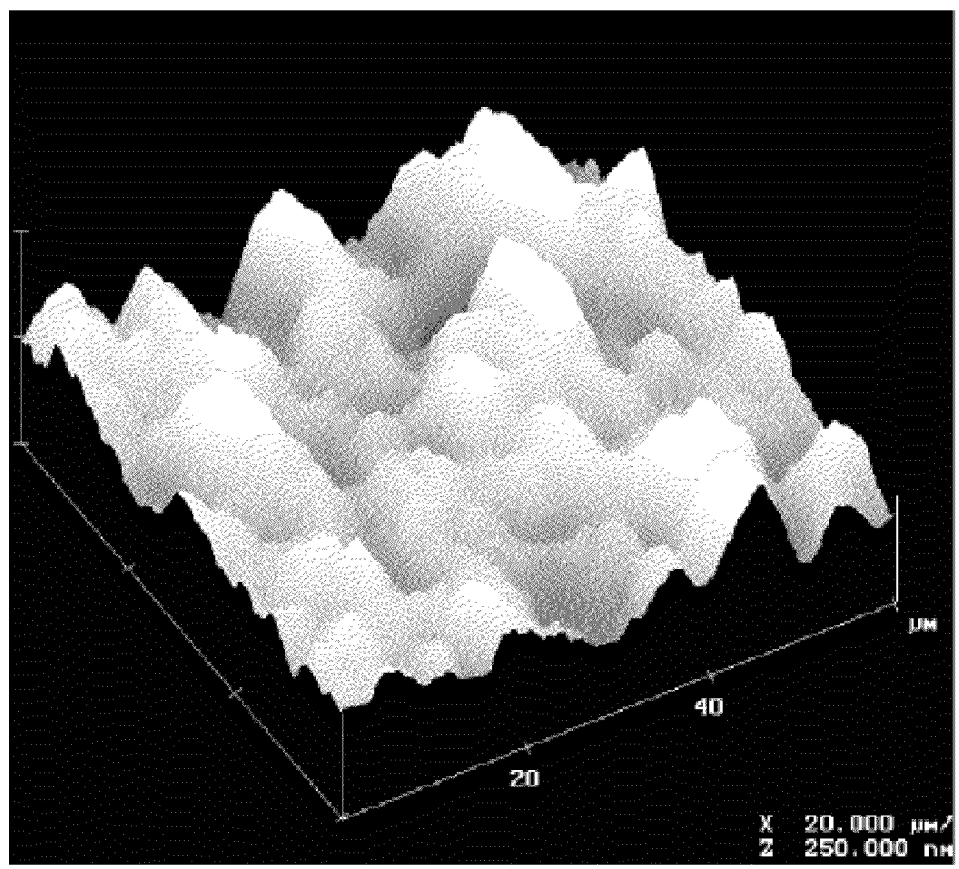
FIG. 7B shows an image of a surface finish of a 300 series stainless steel surface after laser treatment according to certain embodiments.

FIG. 7A shows two images of surface finishes of rolled or coined 300 series stainless steel surface prior to laser treatment. The images are 60×60 micron sized images, with a z-scale of 500 nm per division. Valleys are observed in both images (above left axis). FIG. 7B shows an image of a surface finish of a 300 series stainless steel surface after laser treatment. The z-scale resolution is increased to 250 nm per division for additional clarity of the surface. As compared to the images in FIG. 7A, the high frequency peaks are removed and a much gentler, more continuous surface results from laser treating. No valleys are observed after laser treating.

Figure 8:
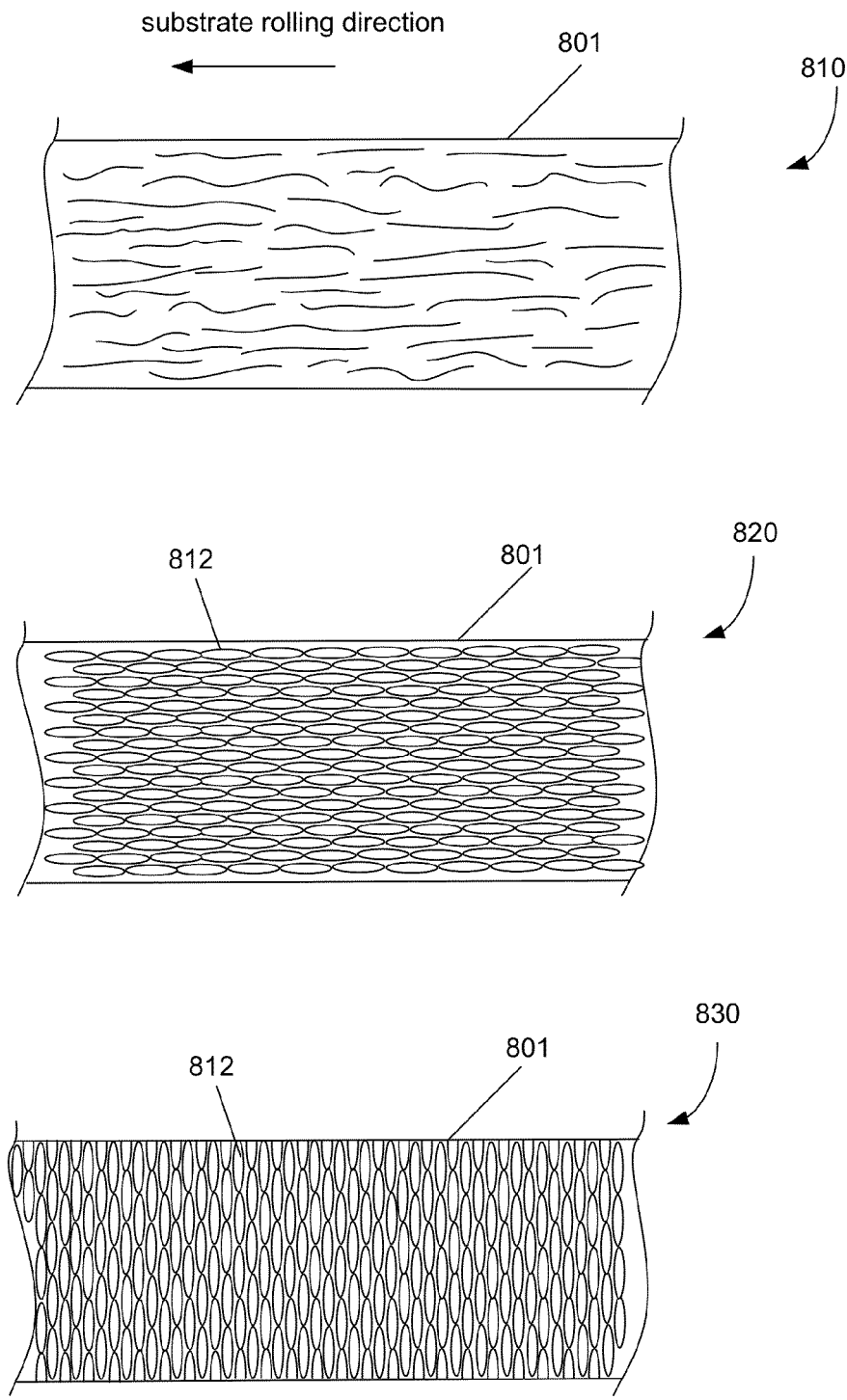
FIG. 8 shows two examples of texturing a surface of substrate in an ellipsoidal pattern according to certain embodiments.

In certain embodiments, texturing the substrate or back contact surface results in substantially uniform features. These features may have substantially circular symmetry as depicted in FIG. 5. In alternate embodiments, the final surface of the melt includes non-uniformities and/or non-circular symmetries. Pits, bumps, sombrero shapes and ellipsoidal shapes can be formed under specific conditions of beam size, shape, power intensity, pulse length, lens shape (spherical, cylindrical, etc.) and the like. In certain embodiments, an ellipsoidal pattern is achieved using a cylindrical front lens. FIG. 8 shows two examples of texturing a surface of substrate 801. At 810, a rolled substrate 801 is depicted. Prior to treatment, the substrate surface as directional features due to rolling (or other surface preparation) direction, which is indicated. Ellipsoidal features are created by using an appropriately shaped lens and/or relative motion between the beam and substrate in the direction of the major axis of the ellipse. At 820, a surface texture pattern having elongated laser features 812 in the longitudinal direction (in the direction of the surface preparation features) is depicted. At 830, a surface texture pattern having elongated laser features 812 in the cross-direction is depicted.

In certain embodiments, the substrate and/or back contact is textured to produce a surface roughness that enhances light trapping. In certain embodiments, peak to peak distance between features to is between about 0.5 microns to about 1 micron, or about 0.5 microns to about 0.9 microns. In certain embodiments, texturing the substrate and/or back contact involves reducing peak height.

Figure 9:
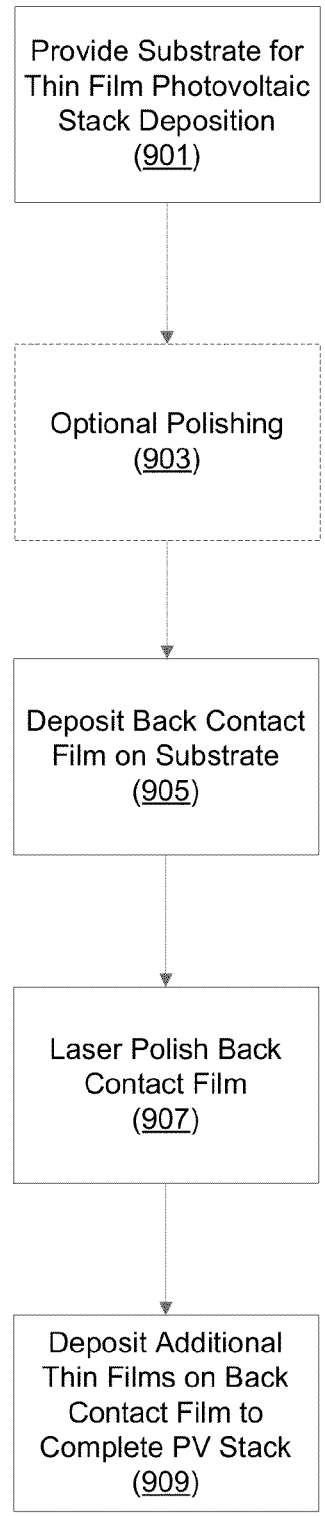
FIG. 9 is a process flow diagram illustrating operations in a method of laser polishing or texturing a back contact film of a thin-film photovoltaic stack according to certain embodiments.

In certain embodiments, laser polishing and retexturing techniques as described above are performed on a back contact layer. In certain embodiments, the back contact layer is molybdenum, niobium, chromium, copper, silver, or combinations of these or other suitable material for forming an ohmic contact. In particular embodiments, the back contact layer includes molybdenum. The laser polishing may be performed on the surface of the deposited back-contact, either exclusively or combined with a substrate polish, prior to the deposition of the remaining photovoltaic material set. FIG. 9 provides a process flow chart illustrating certain operations in a method of laser polishing a back contact layer according to certain embodiments. First, a substrate is provided (901). The substrate may be provided in a web, e.g., a web of stainless steel material, or may be provided as cut sheets. The substrate may be a metallic foil or a conductive polymer material. In certain embodiments, the substrate is series 300 or series 400 stainless steel. The as-provided material may be machine rolled or otherwise pre-treated or worked. At the dimensions of interest to photovoltaic cells, machine rolled material exhibits high frequency roughness as described above with respect to FIG. 4. The substrate is optionally polished (903). According to various embodiments, polishing involves laser polishing as described above. Alternatively, it may involve mechanical polishing, e.g., with an abrasive grit in lieu of or in addition to laser polishing. The substrate is then provided to a deposition chamber, for deposition of the back contact thin-film thereon (905). In many embodiments, deposition of the back contact involves a physical vapor deposition or sputter process, though the methods are not so limited and encompass back contact films deposited by any suitable method.

According to various embodiments, the thickness of the back contact film is between about 0 and 5 microns, e.g., 1 and 5 microns. In certain embodiments, the back contact film thickness is about 5 microns or greater to allow suitable texturing and polishing depths. In certain embodiments, the back contact is less than 1 micron, e.g., about 0.5 microns. In these cases, the depth of the melt pools may be controlled to be relatively shallow, e.g., 10-100 Angstroms.

Once the back contact film is deposited, laser polishing is performed (907). As described above, laser polishing involves exposing multiple localized areas or sites of the back contact film to a laser beam having an intensity and for an exposure time sufficient to create a melt pool centered on each of the localized sites. According to various embodiments, the back contact is exposed to a laser beam to remove particles and organic material that may be present on the film surface or within the film. Also, according to various embodiments, one or more laser beams is rastered over the surface in a specific pattern to texture the surface as described above with respect to FIGS. 5-8.

In certain embodiments, polishing the as-deposited back contact layer alters the microstructure of the back contact layer from having a crystalline structure, or localized areas of crystalline structure, to a substantially amorphous material. In certain embodiments, this involves reducing the thickness of the layer. Also in certain embodiments, polishing the back contact enhances its diffusion barrier characteristics. That is, after polishing, the back contact lowers a diffusion coefficient for the absorber stack constituents, as well as for the constituents of the underlying substrate. In certain embodiments, at least the surface of the back contact is altered to be an amorphous material.

After the back contact film is polished and, in certain embodiments, retextured, an absorber layer is deposited on the back contact layer (909). In certain embodiments, adhesion of the CIGS or other absorber layer is improved by the laser polishing. The adhesion is improved by the presence of textured features and/or the presence of amorphous metal on the surface of the back contact.

Polishing the back contact may result in a superior surface for deposition of an absorber stack than polishing only the underlying substrate. For example, defects introduced during sputtering of the back contact onto a polished or unpolished substrate are eliminated by polishing the substrate.

Another aspect of the invention involves incorporating an element or compound into a substrate or back contact surface during a laser treatment process. In certain embodiments, sodium is incorporated into a photovoltaic stack substrate and/or back contact during a laser polishing, cleaning or retexturing treatment. In particular embodiments, sodium is incorporated into a substrate and/or back contact layer of a CIGS photovoltaic stack. Sodium diffusion has been found to be advantageous during subsequent CIGS growth on the back contact as well as improve conductivity in the CIGS layer.

Figure 10:
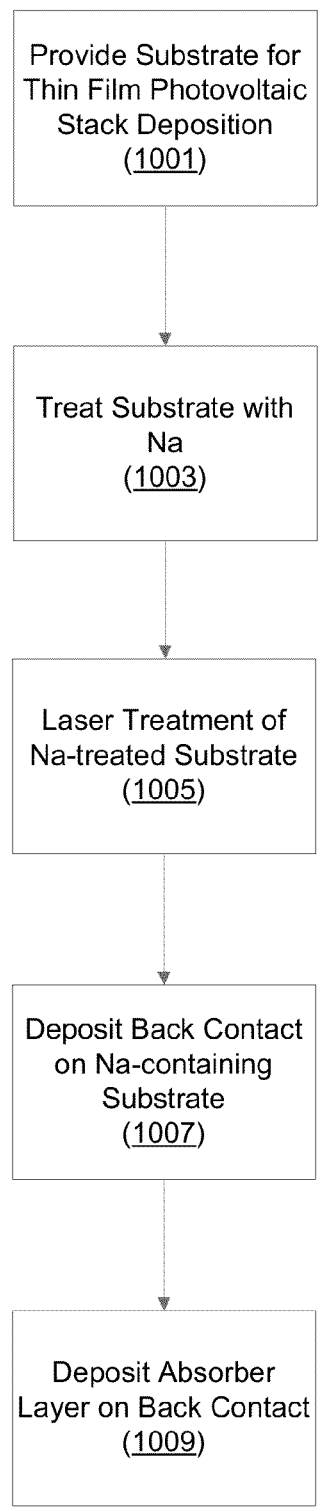
FIGS. 10 and 11 are process flow diagrams illustrating operations in methods of incorporating sodium into a thin-film photovoltaic stack according to certain embodiments.
Figure 11:
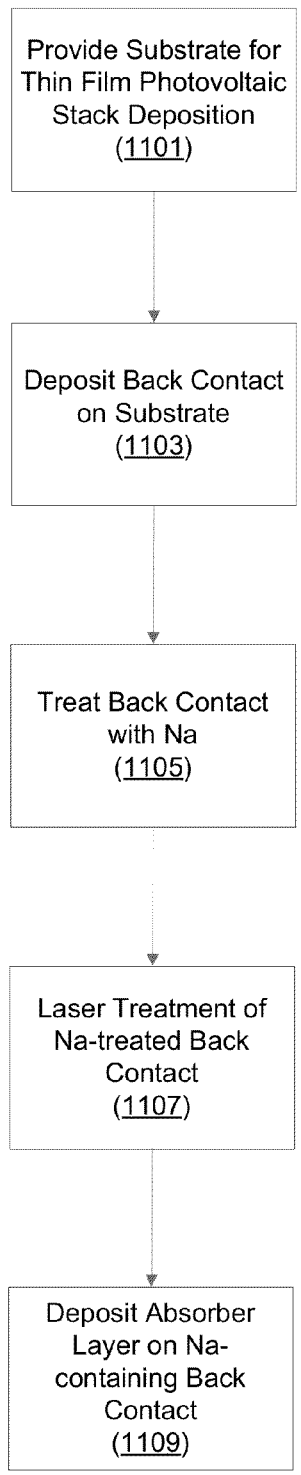

FIGS. 10 and 11 are process flow charts illustrating operations in methods of incorporating sodium into a CIGS photovoltaic stack according to various embodiments. First, in FIG. 10, a substrate for thin-film deposition is provided (1001). The substrate may be a metallic or conductive polymeric substrate. In certain embodiments, the substrate is an aluminum substrate or stainless steel. The substrate is then treated with sodium or a sodium containing compound (1003). Treating the substrate may involve exposing it to sodium vapor such that sodium absorbs onto the substrate, spraying, depositing or otherwise applying a coating of a metal salt to the substrate, applying a coating compound containing sodium to the substrate, etc. In certain embodiments, a thin layer of sodium or sodium containing compound, e.g., NaF, NaCl, NaS, is deposited as a solid or precipitated as a liquid on the surface. In certain embodiments, a thin layer of a compound of metal and sodium is deposited on the surface of the substrate.

The sodium coated or treated substrate is then laser treated (1005). Laser treating involves exposing the substrate to radiation from a laser beam at multiple spots across the substrate. This creates a melt pool of the sodium and substrate material at each spot, allowing incorporation of the sodium into the substrate surface. If a sodium-containing compound is used, laser treating dissociates the compound, with the sodium intermixed in the surface layers. The remaining byproducts (e.g., fluorine, chlorine, and the like) are reacted with a controlled reactive gas or getter system. In certain embodiments, operations 1003 and 1005 overlap or are performed simultaneously. For example, in certain embodiments, the substrate is exposed to an overpressure of sodium vapor or a sodium containing compound as it is irradiated. This results in the sodium being intermixed in the surface layers.

The back contact layer, e.g., a molybdenum film, is then deposited on the substrate (1007). An absorber layer, e.g., a CIGS layer, is then deposited on the back contact (1009). The sodium diffuses from the substrate to the back contact, where it may diffuse from to reach the CIGS layer.

In certain embodiments, the methods involve forming a sodium concentration gradient in the substrate material, with the highest concentration at the top or front surface. This is possible due to the laser treatment of the substrate surface. Accordingly, in certain embodiments, the methods require less sodium. According to various embodiments, sodium is incorporated to be between about 0.5% and 5% by weight of the substrate.

FIG. 11 is process flow chart illustrating operations in another method of incorporating sodium into a CIGS stack in which the sodium is incorporated into the back contact layer in the same manners as described above for the substrate. In this method, a substrate is provided as described above (1101). The substrate may be polished or unpolished. A back contact, e.g., a molybdenum thin-film, is then deposited on the substrate (1103). The back contact is then treated with sodium (1105). Treating the back contact may involve exposing it to sodium vapor such that sodium absorbs onto the back contact, spraying, depositing or otherwise applying a coating of a metal salt to the substrate, applying a coating compound containing sodium to the substrate, etc. In certain embodiments, a thin layer of sodium or sodium containing compound, e.g., NaF, NaCl, NaS, is deposited as a solid or precipitated as a liquid on the back contact surface. In certain embodiments, a thin layer of a compound of metal and sodium is deposited on the surface of the back contact The back contact then undergoes laser treatment, to melt the molybdenum or back contact, and in certain cases sodium, thereby incorporating the sodium into the back contact (1107). In certain embodiments, operations 1105 and 1107 overlap or are performed simultaneously. For example, in certain embodiments, the back contact is exposed to an overpressure of a sodium vapor or a vapor of a sodium-containing compound as the back contact is irradiated. An absorber layer, e.g., a CIGS layer, is then deposited on the back contact (1109). The sodium diffuses from the substrate to the back contact, where it may diffuse from to reach the CIGS layer.

According to various embodiments, the sodium may be substantially uniformly incorporated in the back contact layer, or it may be incorporated such that there is a concentration gradient with the highest concentration at the top surface of the back contact layer. Other methods of incorporating sodium into the back contact generally involve the reverse concentration gradient, e.g., by supplying a sodium source such as lime glass at the back side of the metal contact. According to various embodiments, sodium is incorporated to be between about 0.5% and 5% by weight of the back contact layer.

While the above examples refer to incorporation of sodium into the substrate and/or back contact layer, other elements or compounds may be incorporated in addition to or instead of sodium. These compounds may be coated on or otherwise applied as described above. In certain embodiments, a noble or reactive gas is used in conjunction with the laser process to control the final material composition in the solidified substrate or back contact melt. An example of an apparatus to implement this aspect of the invention is described below with reference to FIGS. 13A and 13B.

In a particular example, oxygen or an oxygen-containing gas is flowed over the surface being polished to increase oxygen content in the polished film. In another example, a reducing gas is flowed over the surface to reduce the oxygen content. For example, oxygen content may be controlled to control the mobility characteristics of species diffusing through molybdenum.

Figure 12A:
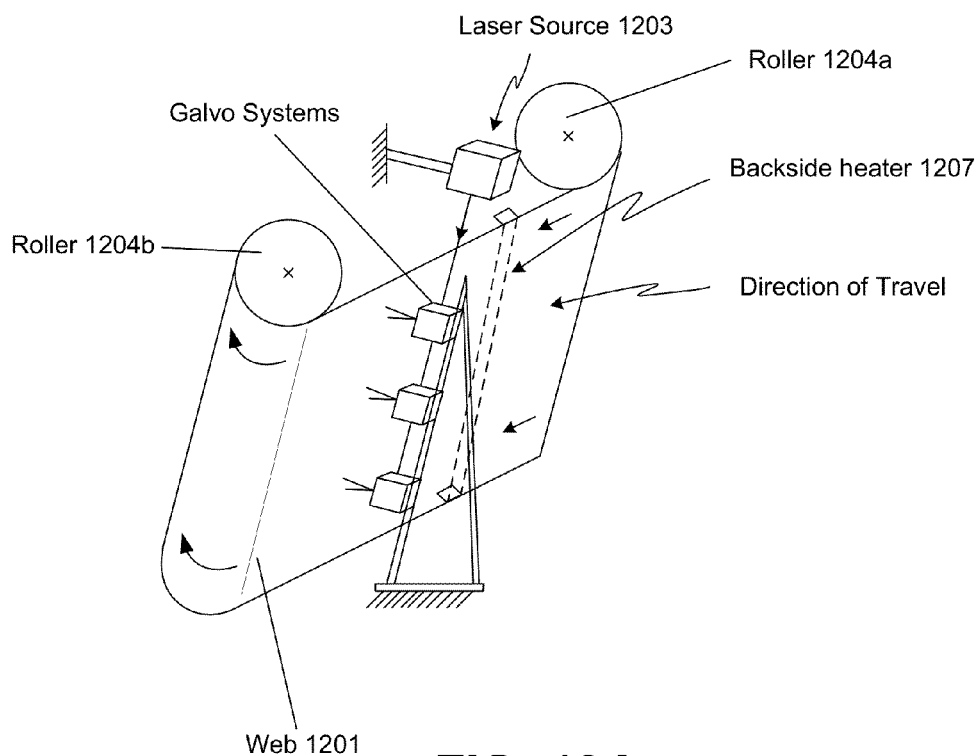
FIGS. 12A and 12B depict components of a laser polishing apparatus according to certain embodiments.
Figure 12B:
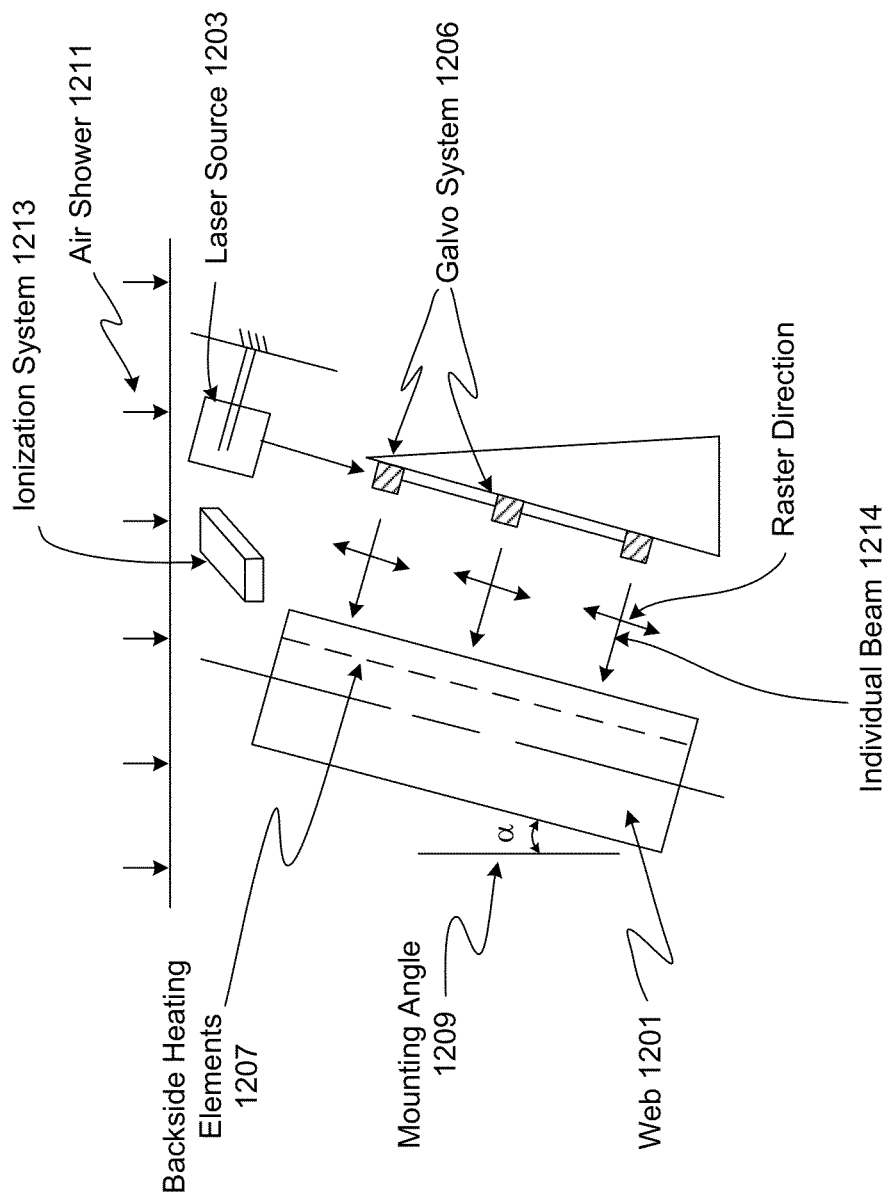

Provided herein are apparatuses for carrying out the above-described methods. The methods may also be performed with other laser systems. FIGS. 12A and 12B depict an apparatus according to certain embodiments, with FIG. 12A showing a perspective view and FIG. 12B a side view of the apparatus. As described above, in certain embodiments, a web substrate is laser polished prior to entering a deposition apparatus. The apparatus is configured to laser treat a web substrate, e.g., a thin metal foil, and/or a back contact layer deposited on a web substrate.

In the figures, the web 1201 is tensioned between two guide rollers 1204a and 1204b. Unpolished substrate is around roller 1204a, polished substrate around roller 1204b. In certain embodiments, one or both of the guide rollers may not be present, e.g., they may be replaced with a spool. For example, in certain embodiments, unpolished substrate may be taken off a spool, polished and then guided into a deposition apparatus as described above with respect to FIG. 3.

A laser source 1203 emits a laser beam that is scanned in a cross-web direction by three galvo system 1206. Individual beams 1214 are emitted from each galvo system 1206. The system, including web, laser source and galvo mirrors are at a slight off-angle (mounting angle 1209) which may in certain embodiments, 1°-20° from vertical, or 5°-15° from vertical to ensure particulates and materials released from the laser process fall away from the film, and do not fall onto the galvo lenses.

In certain embodiments, an air shower 1211 is used together with gravity and an ionization system 1213 to further ensure continued clean operation across the entire web and to ensure the expulsion of released material. The galvo systems 1204 may be spaced about one foot or less away from the web, and include galvo mirrors to raster the beam in a cross-web direction. In certain embodiments in which multiple galvo systems are used, one or more of the galvo systems includes a beam splitter to direct a beam to the next galvo system as well to the web. This allows, according to certain embodiments, a single laser source 1203 to be used with beam splitters in the galvo systems 1206. The rastering process is in the near-vertical direction, while the web 1201 transverses along the length direction. One or more backside heating or cooling elements 1207 is placed near or along the web to control the temperature as needed. According to various embodiments, backside temperature is controlled at a set level between about 0 and 100° C.

Using multiple lasers, or a single laser with split beams, and multiple galvo systems increase system throughput. The laser source may be any of a single, double or quadrupled Nd:YAG or Nd:YLF laser, a carbon dioxide gas laser, and excimer source, or any other laser capable of producing the power (10-1000 W), power density (5-200 micron spot size), controlled pulse duration (0.1-100 ns) and repetition rate (100 kHz-1000 kHz) used for the treatment method. The laser wavelength may range from about 400 nm to 10 microns. The galvo systems accurately support adjacent spot placement tolerances of less than 5 microns, or less than 2 microns, at a repeating frequency of at least about 100 kHz. In alternate embodiments, multiple laser sources are used, or a single laser source and galvo system may be sufficient depending on the web size.

Figure 13A:
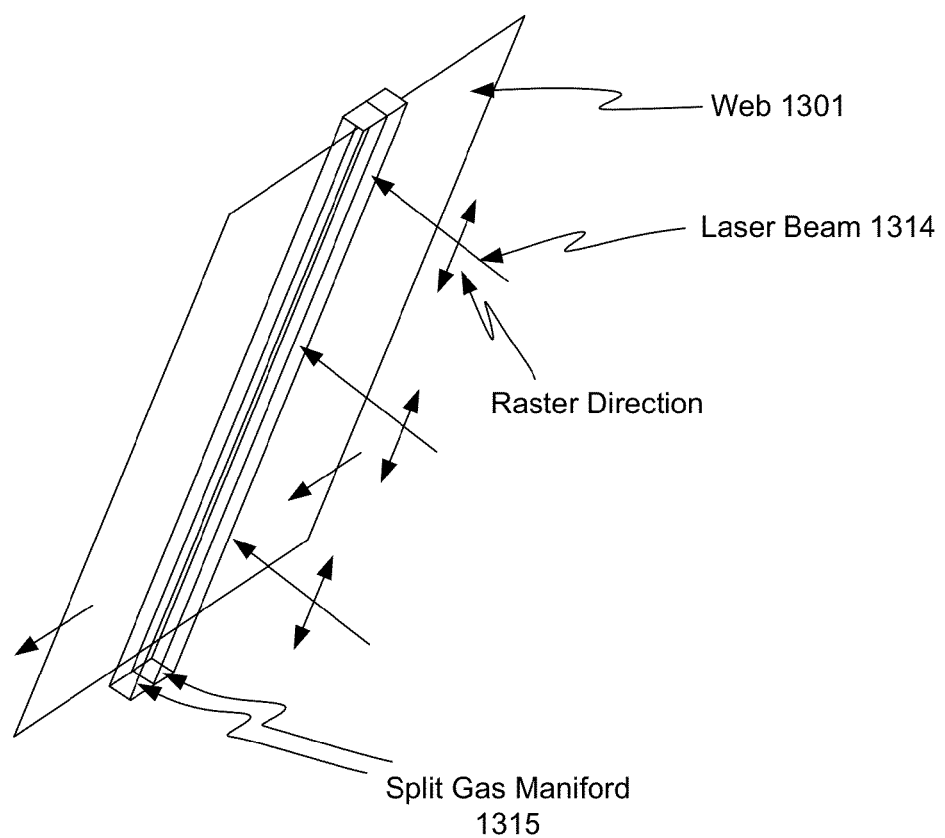
FIGS. 13A and 13B depict components of a laser treatment apparatus according to certain embodiments.
Figure 13B:
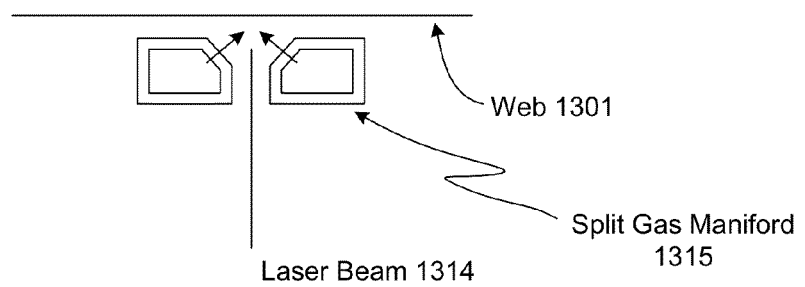

FIGS. 13A and 13B illustrate a gas over-pressure system according to certain embodiments, which may be used to incorporate sodium or other components into a surface material. A split gas manifold 1315 is positioned on either side of the laser beam 1314. The manifold 1315 extends across the web to flow gas in the proximity of the laser operation. A top view of the manifold 1315 is depicted in FIG. 13B. The manifold is configured to direct gas toward intersection of the laser beam 1314 and the web 1301 from either side of the laser beam 1314.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

The invention claimed is:

1. A method of polishing a back contact of a thin-film photovoltaic stack, the method comprising:
   providing a substrate having a back contact layer for a thin-film photovoltaic stack deposited thereon; and
   polishing a front surface of the back contact layer by forming surface features in the front surface, wherein forming surface features comprises rastering one or more laser beams over the front surface.

2. The method of claim 1 wherein the back contact layer comprises a material selected from the group consisting of molybdenum, niobium, copper and silver.

3. The method of claim 1 wherein the back contact layer comprises molybdenum.

4. The method of claim 1 wherein the substrate is a metal foil.

5. The method of claim 1 wherein the substrate is a stainless steel foil.

6. The method of claim 1 further comprising depositing one or more thin-film layers configured to absorb solar energy on the back contact.

7. The method of claim 6 wherein the one or more thin-film layers comprise CIGS or CIS.

8. The method of claim 1 wherein rastering one or more laser beams over the front surface comprises increasing the amorphous character of the back contact layer.

9. The method of claim 1 wherein the substrate is providing as a web and wherein polishing a front surface of the back contact layer comprises forming multiple rows of surface features in the front surface, wherein forming a row of surface features comprises rastering one or more laser beams over the front surface in a cross-web direction.

10. The method of claim 9 wherein the surface features of a row overlap with the surface features of each adjacent row.

11. The method of claim 1 wherein the back contact is about 0.5 microns thick.

12. The method of claim 1 wherein the back contact is between about 1 and 5 microns thick.

13. The method of claim 1 wherein the surface of the web substrate is not laser polished prior to deposition of the back contact layer.

14. The method of claim 1 further comprising laser polishing the surface of the web substrate prior to the deposition of the back contact layer.

15. A method of polishing a back contact of a thin-film photovoltaic stack, the method comprising:
- providing a substrate having a back contact layer for a thin-film photovoltaic stack deposited thereon;
- irradiating a front surface of the back contact layer with laser energy to heat the surface in localized areas of between 5 to 200 microns and form a plurality of shallow, rapidly expanding melt pools;
- after forming the melt pools, cooling the front surface to form a smoothed surface.

16. The method of claim 15 wherein the irradiating the front surface with laser energy comprises exposing the front surface to laser beams at a rate of about 10-1000 kHz.

17. The method of claim 15 wherein the smoothed surface comprises interconnected surface features, said features having a frequency of 1-200 microns.

18. The method of claim 17 wherein the interconnected surface features have a maximum aspect ratio of no more than 1:1.

19. The method of claim 15 further comprising controlling the temperature of a back surface of the substrate during laser irradiation of the front surface of the back contact.

20. The method of claim 15 wherein the substrate is oriented at an angle of no more than 10° from vertical during the irradiation.

* * * * *